US005153453A

United States Patent [19]

Walters

[11] Patent Number: 5,153,453

[45] Date of Patent: Oct. 6, 1992

[54] HIGH VOLTAGE MAJORITY CARRIER RECTIFIER

[75] Inventor: Michael M. Walters, Endwell, N.Y.

[73] Assignee: International Business Machines Corp., Armonk, N.Y.

[21] Appl. No.: 745,791

[22] Filed: Aug. 16, 1991

[51] Int. Cl.[5] .......................... H03K 5/08; H03K 3/33

[52] U.S. Cl. ................................ 307/317.1; 307/568; 307/571; 328/26

[58] Field of Search ............... 307/544, 568, 571, 584, 307/317.1, 317.2, 304, 319, 320; 328/26

[56] References Cited

U.S. PATENT DOCUMENTS

| | | | |
|---|---|---|---|
| 2,876,366 | 3/1959 | Hussey | 307/256 |
| 3,392,352 | 7/1968 | White | 307/304 |
| 3,532,899 | 10/1970 | Huth et al. | 307/304 |
| 3,543,052 | 11/1970 | Kahng | 307/238 |
| 3,577,062 | 5/1971 | Hoffman | 323/8 |
| 4,020,365 | 4/1977 | Weir | 307/571 |
| 4,321,524 | 3/1982 | Petrovic | 323/229 |
| 4,336.489 | 6/1982 | Frederiksen | 323/321 |
| 4,398,142 | 8/1983 | Beasom | 323/226 |
| 4,402,003 | 8/1983 | Blanchard | 357/43 |
| 4,484,206 | 11/1984 | Moroshima et al. | 357/13 |
| 4,686,449 | 8/1987 | Jeffrey et al. | 323/231 |
| 4,875,151 | 10/1989 | Ellsworth et al. | 363/127 |
| 4,877,982 | 10/1989 | Walker | 307/584 |
| 5,008,565 | 4/1991 | Taylor | 307/296.7 |

*Primary Examiner*—Janice A. Howell
*Assistant Examiner*—Toan Tran
*Attorney, Agent, or Firm*—William H. Steinberg

[57] ABSTRACT

A rectifier circuit is provided including a MOSFET having a gate, a drain, and a source terminal. A Schottky diode is connected in series with the MOSFET. The cathode of the Schottky diode is connected to the source of the MOSFET. A zener diode is connected in parallel with a capacitor. A recharging diode has its anode connected to the junction between the MOSFET and the Schottky diode and its cathode connected to the cathode of the zener diode, with the drain serving as the cathode of rectifier circuit and the anode of the Schottky diode serving as the anode of the rectifier circuit. The rectifier circuit has a fast recovery time and is suitable for both high frequency and high voltage, power conversion applications. The rectifier circuit can be used in place of P-N junction fast recovery diodes with less complex snubbers and switch aiding circuits.

10 Claims, 1 Drawing Sheet

HIGH VOLTAGE MAJORITY CARRIER RECTIFIER

BACKGROUND OF THE INVENTION

The present invention relates to a rectifier device and more particularly to majority carrier rectifier device for use in place of power rectifier diodes.

Advances toward smaller and more efficient power supplies are limited by the non-ideal characteristics of today's high-voltage power diodes. An ideal diode for high-voltage power applications would be characterized by a conduction state with zero forward voltage and a blocking state with unlimited voltage capability. Additionally the ideal diode would transition smoothly, in zero time, between the two states. Although a non-zero forward voltage drop and a finite reverse leakage current limits the efficiency of real diodes, other inherent characteristics limit the frequency at which they can be used. One way to decrease the size and weight of power supplies is to increase the rectification frequency. Therefore, the currently available high-voltage diodes are limiting the progress toward smaller power supplies.

The P-N junction diode and the Schottky barrier diode are the devices of choice for power applications. While both devices deviate from the ideal diode, the Schottky diode has a low reverse voltage capability and therefore, it is not suitable for high voltage applications. The P-N diode can blocking higher reverse voltages, but it does not transition smoothly from the conduction state to the blocking sate, thus it limits the rectification frequency of power supplies.

The P-N junction diode is a minority carrier device that requires a finite time to regain its blocking state after conduction. This finite time is the reverse recovery time required to deplete the minority carrier charge stored at the junction. During the reverse recovery interval, very large reverse currents flow because the minority carrier charge maintains the junction in the conduction state. The large reverse currents are a source of noise that must be attenuated to meet the electromagnetic interference (EMI) requirements of the power supply. The magnitude of the reverse current can be controlled by adding components to the external circuit. Yet this will result in a longer recovery interval and increased power dissipation. The reverse recovery interval degrades the performance of the power converter during a portion of the total rectification period. Therefore, as the frequency of rectification increases (and the period decreases) the P-N diode reverse recovery time will become a larger portion of the total rectification period. For a given set of noise and efficiency requirements the P-N junction diode will limit the frequency of operation of the power converter.

Schottky diodes are majority carrier devices, and so they do not have the same rectification frequency limitation as the P-N junction diodes. However, Schottky diodes are limited to low voltage applications. The reverse blocking voltage is a function of both the silicon doping and the physical thickness of the epitaxial and metallurgical junction layers. The epitaxial layer thickness and resistivity can be increased for higher voltage blocking capability, but only with an increase in forward voltage drop. It is this forward voltage versus reverse voltage breakdown tradeoff that has limited Schottky diodes to low voltage applications.

It is an object of the present invention to provide a rectifier for use in high frequency. and high voltage power applications.

It is a further object of the present invention to provide a rectifier device that requires less complex snubbers and switching said networks when used in applications formerly using a fast recovery P-N diode.

SUMMARY OF THE INVENTION

In one aspect of the present invention a rectifier circuit is provided including a MOSFET having a gate, a drain, and a source terminal. A low forward drop, high transition speed diode is connected in series with the MOSFET. The cathode of the low forward drop diode is connected to the source of the MOSFET. The drain terminal of the MOSFET serves as the cathode terminal of the rectifier circuit and the anode terminal of the low forward drop diode serves as the anode terminal of the rectifier circuit. A drive circuit is connected to the gate of the MOSFET for turning the MOSFET on responsive to a voltage across the rectifier in the forward direction and turning the MOSFET off responsive to a voltage applied to the rectifier circuit in the reverse direction.

In another aspect of the present invention a rectifier circuit is provided including an n-channel MOSFET having a gate, a drain, and a source terminal. A Schottky diode is connected in series with the MOSFET. The cathode of the Schottky diode is connected to the source of the MOSFET. A voltage clamp is connected in parallel with a capacitor. A recharging diode has its anode connected to the junction between the MOSFET and the Schottky diode and its cathode connected to one end of the voltage clamp limiting the maximum charge on the capacitor. The drain of the MOSFET serves as the cathode of rectifier circuit and the anode of the Schottky diode serves as the anode of the rectifier circuit.

DETAILED DESCRIPTION OF THE INVENTION

Figure 1:
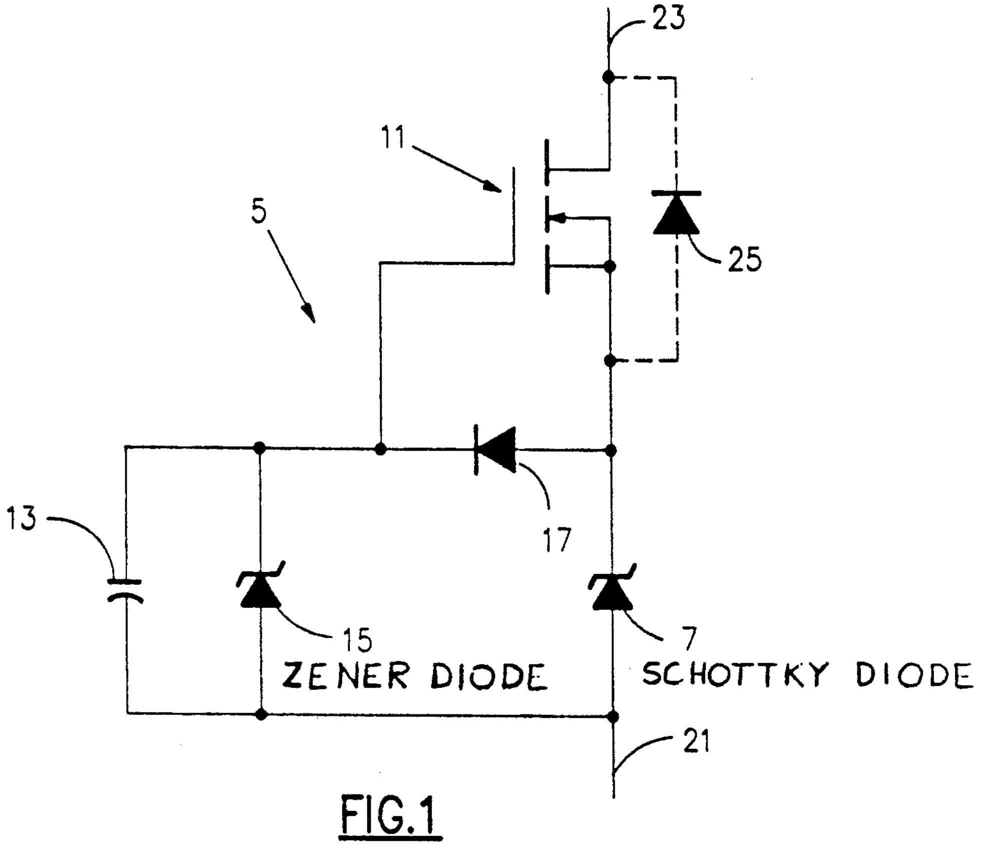
FIG. 1 shows a schematic diagram of a rectifier device using an n-channel MOSFET in accordance with the present invention.

Referring now to the drawing and particularly FIG. 1 thereof, a two terminal majority carrier rectifier device 5 comprising a high transition speed, low forward voltage drop diode 7, an n-channel MOSFET 11 and a drive circuit including a capacitor 13, a voltage clamp 15, and a diode 17 is shown. A diode with high transition speed is a majority carrier device without the recovery time characteristic of a P-N junction diode. Low forward drop diode refers to diodes having a forward voltage drop less than a P-N junction diode forward voltage drop. The anode terminal 21 of the rectifier device is connected to the anode of diode 7 which in the preferred embodiment is a Schottky diode, also known as a hot carrier diode. The cathode of the Schottky diode 7 is connected to source of the n-channel MOSFET 11. The drain of the MOSFET serves as the cathode terminal 23 of the rectifier device. The diode 25, shown connected by dashed lines is the internal diode of the MOSFET 11. Capacitor 13 is coupled in parallel with the voltage clamp 15 shown as a zener diode. The cathode of the zener diode 15 is connected to the gate of MOSFET 11 and to the cathode of diode 17. The anode of diode 17 is connected to the junction of the cathode of the Schottky diode 7 and the source of MOSFET 11. Diode 17 can comprise a P-N junction diode. The anode of zener diode 15 and the anode of the Schottky diode 7 are connected together.

In steady state operation, when the voltage at cathode terminal 23 is greater than the voltage at anode terminal 21 of rectifier device 5, capacitor 13 stores a voltage approaching the breakdown voltage of zener diode 15. When a forward potential is applied from the anode terminal 21 to the cathode terminal 23 of rectifier device 5, the voltage across Schottky diode 7 begins to decrease and the Schottky diode becomes forward biased. The gate to source voltage of MOSFET 11 increases when charge from capacitor 13 is transferred to the internal gate to source capacitance, turning MOSFET 11 on. Forward current flows in the MOSFET from source to drain, in contrast with the normal mode of operation of N-channel FETs in which forward current flows from drain to source. In the normal mode of operation when the MOSFET is turned off the internal diode provides voltage blocking. The total forward rectifier device 5 voltage is the summation of the Schottky anode to cathode and MOSFET source to drain voltages. The MOSFET voltage drop is a function of the on resistance of the MOSFET multiplied by the forward current carried by the MOSFET.

MOSFET 11 is selected so that for the forward current carried by the rectifier device a voltage drop in the MOSFET does not result, that is sufficient to exceed the forward voltage drop of internal diode 25, which would cause internal diode 25 to conduct. Internal diode 25 is a P-N junction minority carrier device with a finite reverse recovery time. If the internal diode were to become forward biased, the recovery time of the rectifier device would be dependent on the recovery time of the internal diode 25. The breakdown voltage of zener diode 15 is selected to be less than either the maximum gate to source voltage of MOSFET 11 or the breakdown voltage of the Schottky 7. Capacitor 13 is selected to have a larger capacitance than the gate to source capacitance of the MOSFET.

When a reverse potential is applied to rectifier device 5, making cathode terminal 23 more positive than anode terminal 21, current flows through MOSFET 11, and a reverse current flows through Schottky diode 7 which will add charge to the Schottky barrier capacitance. The MOSFET current will further increase the Schottky terminal voltage, and decrease the MOSFET gate to source voltage. After the gate to source voltage of MOSFET 11 falls below the threshold level, MOSFET 11 is turned off and current is diverted from the MOSFET channel to the parasitic capacitances in parallel with the MOSFET. The MOSFET capacitor current will further increase the Schottky diode 7 cathode to anode voltage and further decrease the MOSFET gate to source voltage until diode 17 becomes forward biased. The remaining reverse current will add charge to capacitor 13 until capacitor 13 is clamped by zener diode 15. The rectifier device 5 has a reverse voltage blocking capability from cathode terminal 23 to anode terminal 21 equal to the breakdown voltage of the MOSFET 11 plus the breakdown voltage of zener diode 15.

The voltage on capacitor 13 at the beginning of each rectification cycle is assumed to be approaching the breakdown voltage of zener diode 15. However, during the initial rectification cycle the voltage on capacitor 13 can be zero due to capacitor 13 parasitic leakage current. In the first rectification cycle, the rectifier device 5 will conduct forward current through the MOSFET's internal diode 25 since MOSFET 11 is not turned on. The turn-off interval of the rectifier device during an initial cycle when the capacitor 13 is not charged will be determined by the turn off characteristic of internal diode 25. During the first turn-off interval, reverse current will flow through the MOSFET's internal diode 11, and a reverse current will charge up the Schottky barrier capacitance. Diode 17 will become forward biased and the voltage on capacitor 13 will increase until it is clamped by zener diode 15. With capacitor 13 charged to the breakdown voltage of zener diode 15, subsequent applications of forward and reverse voltages to the terminals of the rectifier device will operate under steady state conditions as previously described.

Figure 2:
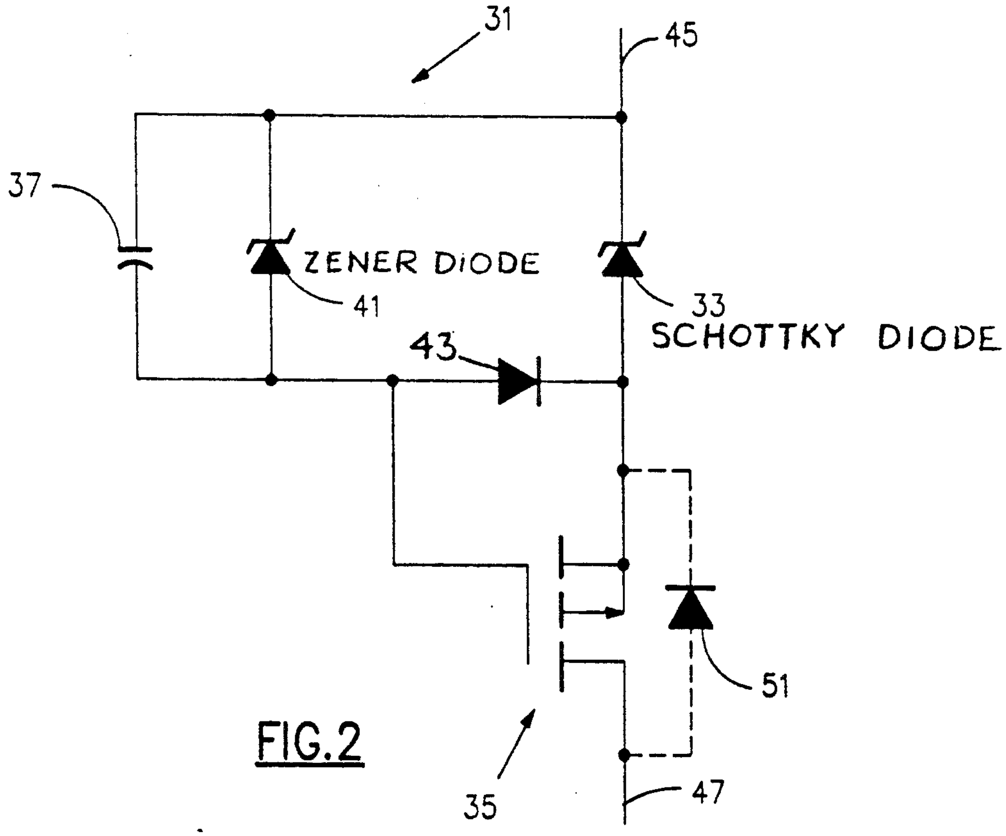
FIG. 2 shows a schematic diagram of a rectifier device using a p-channel MOSFET in accordance with the present invention.

Referring now to FIG. 2, a two terminal majority carrier rectifier device 31 comprising a high transition speed, low forward voltage drop diode 33, a p-channel MOSFET 35 and a drive circuit including a capacitor 33, a voltage clamp 41, and a diode 43 is shown. A diode with high transition speed is a majority carrier device without a recovery time characteristic of a P-N junction diode. Low forward drop diode refers to diodes having a forward voltage drop less than a P-N junction diode forward voltage drop. The cathode terminal 45 of the rectifier device is connected to the cathode of diode 33, which in the preferred embodiment is a Schottky diode, also known as a hot carrier diode. The anode of the Schottky diode 33 is connected to the source of the p-channel MOSFET 35. The drain of the MOSFET serves as the anode 47 of the rectifier device. The diode 51, shown connected by dashed lines is the internal diode of the MOSFET 35. Capacitor 37 is coupled in parallel with the voltage clamp 41 shown as a zener diode. The anode of the zener diode 41 is connected to the gate of MOSFET 35 and to the anode of diode 43. The cathode of diode 43 is connected to the junction of the anode of Schottky diode 33 and the source of MOSFET 35. Diode 43 can comprise a P-N junction diode. The cathode of zener diode 41 and the cathode of Schottky diode are connected together.

In steady state operation, when the voltage at cathode terminal 45 is greater than the voltage at anode terminal 47 of rectifier device 31, capacitor 37 stores a voltage approaching the breakdown voltage of zener diode 41. When a forward potential is applied from anode terminal 47 to cathode terminal 45 of rectifier device 31, the voltage across Schottky diode 33 begins to decrease and the Schottky diode becomes forward biased. The gate to source voltage of MOSFET 35 decreases to a negative value when charge from capacitor 37 is transferred to the internal gate to source capacitance turning MOSFET 35 on. Forward current flows in the MOSFET from drain to source, in contrast with the normal mode of operation of p-channel FETs in which forward current flows from source to drain. In the normal mode of operation when the MOSFET is turned off, the internal diode provides voltage blocking. The total forward rectifier device 31 voltage is the summation of the MOSFET drain to source voltage and the Schottky anode to source voltages. The MOSFET voltage drop is a function of the on resistance of the MOSFET multiplied by the forward current carried by the MOSFET.

MOSFET 35 is selected so that for the forward current carried by the rectifier device, a voltage drop in the MOSFET does not result, is sufficient to exceed the forward voltage drop of internal diode 51, which would cause internal diode 51 to conduct. Internal diode 51 is a P-N junction minority carrier device with a finite reverse recovery time. If the internal diode where to become forward biased, the recovery time of the rectifier device would be dependent on the recovery time of the internal diode 51. The breakdown voltage of zener diode 41 is selected to be less than either the maximum source to gate voltage of MOSFET 35 or the breakdown voltage of the Schottky 33. Capacitor 37 is selected to have a larger capacitance than the gate to source capacitance of the MOSFET.

When a reverse potential is applied to rectifier device 31, making cathode terminal 45 more positive than anode terminal 47, a reverse current flows through Schottky diode 33 to add charge to the Schottky barrier capacitance and a current flows through MOSFET 35. The gate to source voltage of MOSFET 35 increases as the reverse voltage across Schottky diode 33 increases. After the gate to source voltage of MOSFET 35 climbs above the threshold level, MOSFET 35 is turned off and current is diverted from the MOSFET channel to the parasitic capacitances in parallel with the MOSFET. The MOSFET capacitor current will further increase the Schottky diode 33 cathode to anode voltage and further increase the MOSFET gate to source voltage until diode 43 becomes forward biased. The remaining reverse current will add charge to capacitor 37 until capacitor 37 is clamped by zener diode 41. The rectifier device 31 has a reverse voltage blocking capability from cathode terminal 45 to anode terminal 47 equal to the breakdown voltage of zener diode 41 plus the breakdown voltage of MOSFET 35.

The voltage on capacitor 37 at the beginning of each rectification cycle is assumed to be approaching the breakdown voltage of zener diode 41. However, during the initial rectification cycle the voltage on capacitor 37 can be zero due to capacitor 37 parasitic leakage current. In the first rectification cycle, the rectifier device 31 will conduct forward current through the MOSFET's internal diode 51 since MOSFET 35 is not turned on. The turn-off interval of the rectifier device during an initial cycle when the capacitor 37 is not charged will be determined by the turn off characteristic of internal diode 51. During the first turn-off interval, reverse current will flow through the MOSFET's internal diode, and a reverse current will charge up the Schottky barrier capacitance. Diode 43 will become forward biased and the voltage on capacitor 37 will increase until it is clamped by zener diode 41. With capacitor 37 charged to the breakdown voltage of zener diode 41, subsequent applications of forward and reverse voltages to the terminals of the rectifier device will operate under steady state conditions as previously described.

The rectifier devices 5 and 31 are suitable for both high frequency and high voltage power conversion applications. The turn-off behavior is characteristic of a majority carrier rectifier. Therefore, the rectification frequency is limited only by the Schottky and MOSFET capacitances. The forward voltage drop of the rectifier device is competitive with a fast recovery, P-N diode. The MOSFET's on resistance is selected to prevent conduction of the internal diode. The total rectifier device forward voltage is the summation of the Schottky and MOSFET forward voltages. The total rectifier voltage drop will typically be under one volt at the rated current.

The rectifier devices can be fabricated in a monolithic structure to minimize the parasitic impedances which limit high frequency operation. Alternatively, discrete dice performing different circuit functions can be combined in a package, resulting in increased parasitic impedances due to the interconnections and reduced high frequency performance. In applications where reduced high frequency performance is acceptable discrete components can be used.

While the invention has been particularly shown and described with reference to a preferred embodiment thereof, it will be understood by those skilled in the art that various changes in form and detail may be made without departing from the spirit and scope of the invention.

What is claimed is:

1. A rectifier circuit comprising:

an n-channel MOSFET having a gate, a drain, and a source terminal;

a Schottky diode connected in series with said MOSFET, a cathode of said Schottky diode connected to the source of said MOSFET, said drain terminal serving as a cathode terminal of said rectifier circuit and an anode of said Schottky diode serving as an anode terminal of said rectifier circuit; and a drive circuit connected to the gate of said MOSFET for turning said MOSFET on and off, said drive circuit responsive to a voltage across said rectifier circuit in the forward direction for turning said MOSFET on, and responsive to a voltage applied to the rectifier circuit in the reverse direction for turning said MOSFET off, said drive circuit further connected to the anode and cathode of said Schottky diode.

2. A rectifier circuit comprising:

a MOSFET having a gate, a source, and a drain terminal;

a low forward drop, high speed diode having one end connected in series to one of the source and drain terminals of said MOSFET, the other end of said diode and the unconnected one of said source and drain terminals providing external terminals for said rectifier circuit, said low forward drop, high speed diode and said MOSFET connected so that when the rectifier circuit is forward biased, said low forward drop, high speed diode is forward biased and said MOSFET is in a conductive state with a forward current flowing in a direction opposite to the normal direction in said MOSFET;

a capacitor;

a voltage clamp connected in parallel with said capacitor; and a recharging diode connected on one end to the junction of said series connected MOSFET and said low forward drop, high speed diode, the other end of said recharging diode connected to one end of said capacitor and the gate of said MOSFET, said recharging diode poled to supply current to said capacitor when said MOSFET is turned off, said voltage clamp limiting the charge on said capacitor, the other end of said capacitor connected to said other end of said low forward voltage drop, high speed diode.

3. The rectifier circuit of claim 2 wherein said MOSFET comprises an n-channel MOSFET.

4. The rectifier circuit of claim 2 wherein said MOSFET comprises a p-channel MOSFET.

5. The rectifier circuit of claim 2 wherein said low forward drop, high speed diode comprises a Schottky diode.

6. The rectifier circuit of claim 2 wherein said voltage clamp comprises a zener diode, said cathode of said recharging diode connected to the cathode of said zener diode.

7. A rectifier circuit comprising:

an n-channel MOSFET having a gate, a drain, and a source terminal;

a low forward drop, high speed diode connected in series with said MOSFET, a cathode of said low forward drop, high speed diode connected to the source of said MOSFET;

a capacitor;

a voltage clamp connected in parallel with said capacitor; and a recharging diode having its anode connected to the junction between said MOSFET and said low forward drop, high speed diode, and having a cathode connected to one end of said voltage clamp and to the gate of said MOSFET, said voltage clamp limiting the charge on said capacitor, the drain of said MOSFET serving as a cathode of said rectifier circuit and an anode of said low forward drop, high speed diode serving as an anode of said rectifier circuit.

8. The rectifier circuit of claim 7 wherein said low forward drop, high speed diode comprises a Schottky diode.

9. The rectifier circuit of claim 7 wherein said voltage clamp comprises a zener diode, said cathode of said recharging diode connected to the cathode of said zener diode.

10. A rectifier circuit comprising:

a p-channel MOSFET having a gate, a drain, and a source terminal;

a Schottky diode connected in series with said MOSFET, an anode of said Schottky diode connected to the source of said MOSFET, said drain terminal serving as an anode terminal of said rectifier circuit and a cathode of said Schottky diode serving as a cathode terminal of said rectifier circuit; and a drive circuit connected to the gate of said MOSFET for turning said MOSFET on and off, said drive circuit responsive to a voltage across said rectifier circuit in the forward direction for turning said MOSFET on, and responsive to a voltage applied to the rectifier circuit in the reverse direction of turning said MOSFET off, said drive circuit further connected to the anode and cathode of said Schottky diode.

* * * * *